(12) United States Patent
Clifford, Jr. et al.

(10) Patent No.: US 7,286,579 B2
(45) Date of Patent: *Oct. 23, 2007

(54) APPARATUS AND METHOD FOR ADJUSTING EXTERNAL-CAVITY LASERS

(75) Inventors: Goorgo M. Clifford, Jr., Los Altos Hills, CA (US); Geraint Owen, Palo Alto, CA (US)

(73) Assignee: Avago Technologies Fiber IP (Singapore) Pte. Ltd, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 11/352,189

(22) Filed: Feb. 10, 2006

(65) Prior Publication Data

US 2006/0198417 A1 Sep. 7, 2006

Related U.S. Application Data

(63) Continuation of application No. 10/374,169, filed on Feb. 25, 2003, now Pat. No. 7,031,353.

(51) Int. Cl.
*H01S 3/10* (2006.01)
*H01S 3/08* (2006.01)

(52) U.S. Cl. .................................. 372/20; 372/102
(58) Field of Classification Search ................. 372/108
See application file for complete search history.

(56) References Cited

U.S. PATENT DOCUMENTS

| 5,130,854 | A | * | 7/1992 | Suzuki | ........................ | 359/823 |
|---|---|---|---|---|---|---|
| 5,172,390 | A | | 12/1992 | Mooradian | | |
| 5,622,417 | A | | 4/1997 | Conner et al. | | |
| 5,771,252 | A | | 6/1998 | Lang et al. | | |
| 5,836,664 | A | | 11/1998 | Conner et al. | | |
| 6,304,586 | B1 | | 10/2001 | Pease et al. | | |
| 6,597,710 | B2 | | 7/2003 | Vilhelmsson et al. | | |
| 6,608,847 | B2 | | 8/2003 | Zhang et al. | | |
| 6,614,829 | B1 | * | 9/2003 | Tuganov et al. | ............ | 372/107 |
| 6,690,690 | B2 | * | 2/2004 | Marron | ........................ | 372/20 |
| 6,731,661 | B2 | | 5/2004 | Trutna, Jr. | | |
| 6,856,632 | B1 | | 2/2005 | Heanue et al. | | |
| 2001/0050930 | A1 | | 12/2001 | Zhang et al. | | |
| 2003/0063633 | A1 | | 4/2003 | Zhang et al. | | |

\* cited by examiner

*Primary Examiner*—Minsun Oh Harvey
*Assistant Examiner*—Phillip Nguyen

(57) ABSTRACT

Adjustment of a tunable external-cavity laser is simplified by incorporating a mount that includes a base, a main body, a reflecting surface, a diffracting surface and a hinge coupling the main body to the base. The laser additionally includes a light source, a converging lens located to receive light from the light source, a tuning mirror and a pivoting arm on which the tuning mirror is mounted. The main body is bounded in part by two plane, external surfaces orthogonal to a common reference plane and angularly separated from one another by an angle. The reflecting surface has a spatial orientation defined by one of the external surfaces and is arranged to receive light from the lens. The diffracting surface has a spatial orientation defined by the other of the external surfaces, and diffracts light received from the reflecting surface towards the tuning mirror. The hinge is located opposite the angle and parallel to the reference plane.

27 Claims, 9 Drawing Sheets

APPARATUS AND METHOD FOR ADJUSTING EXTERNAL-CAVITY LASERS

CROSS-REFERENCE TO RELATED APPLICATION

This application is a continuation of U.S. utility application entitled, "Apparatus and Method for Adjusting External-Cavity Lasers," having Ser. No. 10/374,160, filed Feb. 25, 2003 now U.S. Pat. No. 7,031,353, which is entirely incorporated herein by reference.

BACKGROUND OF THE INVENTION

Semiconductor diode lasers have been used extensively as transmitters for fiber-optic communications. In one common and low-cost implementation, edges of two-opposing end facets of a laser are cleaved to form resonant-reflective surfaces and provide the feedback necessary for laser operation. Such Fabry-Perot (FP) lasers typically emit in multiple longitudinal modes and have large output bandwidths, for example, 3 nanometers (nm) to 150 nm. Output bandwidths as large as about 400 nm are likely in the near future. In another common implementation with slightly increased complexity, a Bragg grating is formed in or adjacent the active region of the FP laser cavity to form a distributed feedback (DFB) laser. DFB lasers have the advantage of producing emission in a single longitudinal mode, which typically has a very narrow bandwidth, for example, less than 0.01 nm. In a third application, a distributed Bragg reflector (DBR) is substituted for each of the cleaved facets of the FP laser. The distributed Bragg reflector causes the laser to emit in a single longitudinal mode.

In advanced Dense-Wavelength-Division Multiplexing (DWDM) fiber-optic communication technology, optical signals each allocated to a different one of many closely-spaced channels are transmitted simultaneously on a single optical fiber. Typical spacings of the channels can range from about 5 nm to as little as 0.4 nm. Closer channel spacings are envisioned. To provide effective DWDM systems, stable and accurate transmitters of predetermined wavelengths are needed for the individual channels. In addition, stable and accurate wavelength-selective receivers are needed to selectively remove or receive the individual channels to minimize crosstalk from other channels. For a DWDM system to operate efficiently, the transmitter and receiver of a given channel should be capable of being tuned with great accuracy and stability to the same wavelength.

Conventional DWDM communication networks typically use semiconductor lasers, which emit light at fixed wavelengths. Although fixed-wavelength semiconductor lasers are satisfactory in many ways, it is anticipated that DWDM communication network will use tunable lasers in future. Tunable lasers have at least two advantages over fixed-wavelength lasers. First, tunable lasers would allow the inventory of lasers needed to equip and maintain a DWDM communication network to be significantly reduced. For example, a single tunable laser could, in principle, replace the 80 lasers of different wavelengths that would otherwise be required to equip an 80-channel DWDM communication network. The second advantage of tunable lasers is that they allow the DWDM communications network of which they are part to be reconfigured dynamically. In this way, the communications network can be controllably modified to accommodate unusual traffic patterns created by special events or by faults in parts of the network.

Another important application for a tunable laser is as a swept local oscillator in an optical spectrum analyzer.

Tunable lasers are being developed in response to the anticipated needs just described. In particular, tunable lasers that have no tuning mechanisms external to the semiconductor device are under development. However, such tunable lasers, in general, suffer from the disadvantage of having a limited tuning range.

Tunable external cavity lasers (ECLs) have also been proposed for use as tunable lasers in DWDM telecommunication systems and other applications. Tunable ECLs incorporating a semiconductor optical gain medium are described, for example, by Day et al. in *Widely Tunable External Cavity Diode Lasers*, 2378 SPIE, 35-41. The tunable ECLs disclosed by Day et al. incorporate a modified laser diode that has an anti-reflective coating on one facet thereof to cause the modified laser diode to operate as an optical gain medium and not as a laser. The uncoated facet defines one end of the external optical cavity. Light emitted from the coated facet is collimated by a collimating lens and the first beam portion is diffracted by a diffraction grating towards a mirror that defines the other end of the external optical cavity. The diffraction grating is rotated about an axis to tune the wavelength $\lambda$ of the ECL. The ECL will lase at a wavelength selected by the grating provided that the selected wavelength within the modified laser diode's spectral gain region and the optical path length of the external cavity is an integral multiple of the selected wavelength. Tuning may also involve adjusting the length of the external cavity by moving the laser diode axially to change the length of the external optical cavity.

A tunable ECL employing a diffraction grating located in an external cavity is disclosed in U.S. Pat. No. 5,172,390 of Mooradian. This ECL requires a complex grating alignment system that significantly increases the cost of the device. Moreover, the tunable ECL disclosed by Mooradian and other similar tunable ECLs have a cavity length typically ranging from 25 millimeters (mm) to over 100 mm. This is in contrast to the much smaller ($\leq 1$ mm) optical cavity length of the FP lasers and DFB lasers described above. As a result, such tunable ECLs are typically much larger in size than fixed-wavelength FP lasers and DFB lasers.

FIG. 1 illustrates a tunable ECL known in the art as a Littman ECL. ECL 10 is composed of a modified laser diode 11, a converging lens 12, a diffraction grating 14 and a tuning mirror 16. The laser diode serves as an optical gain medium and is modified in that it has an anti-reflective coating on its front facet 19. The modified laser diode retains its reflective rear facet 18. The rear facet of the modified laser diode and the tuning mirror define opposite ends of optical cavity 13. The tuning mirror is mounted on an arm (not shown) that is controllably rotatable about a pivot 30 to tune the wavelength of the light generated by the ECL and to vary the optical path length of the optical cavity.

Diffraction grating 14 has a diffracting surface 15 and tuning mirror 16 has a reflecting surface 17. The diffraction grating and the tuning mirror are arranged so that tangents to the diffracting surface and the reflecting surface, respectively, intersect at pivot 30. Modified laser diode 11 is located such that a tangent to rear facet 18 passes through the pivot.

Modified laser diode 11 is capable of generating light over a broad range of wavelengths. Light emitted by the modified laser diode is collimated by converging lens 12 to form an incident beam portion 20. The incident beam portion is incident on diffracting surface 15 of diffraction grating 14 at an angle of incidence $\theta_I$. In this disclosure, angles of incidence, angles of diffraction and angles of reflection are measured relative to the normal to the respective diffracting or reflective surface. The diffraction grating diffracts the incident beam portion at an angle of diffraction $\theta_D$ to provide a diffracted beam portion 22. The angle of diffraction depends in part on the wavelength of the light.

At a wavelength at which the angle of diffraction $\theta_D$ is equal to the angle between the reflective surface 17 of tuning mirror 16 and the diffracting surface 15 of diffraction grating 14, diffracted beam portion 22 is incident on reflecting surface 17 at an angle of incidence of zero. The reflecting surface reflects the light incident on it at an angle of incidence of zero back towards modified laser diode 11 as a return beam. The return beam travels along a path that is the reciprocal of the path of the emitted beam, i.e., along the paths of incident beam portion 20 and diffracted beam portion 22. Converging lens 12 focuses the return beam on modified laser diode 11.

Diffraction grating 14 and tuning mirror 16 collectively constitute a wavelength filter. At a given angle of rotation of the tuning mirror about pivot 30, only one wavelength of the light diffracted by the diffraction grating is incident on reflective surface 17 at an angle of incidence of zero. Only light of this wavelength will fully return to modified laser diode 11 after reflection, and only light of this wavelength is able to stimulate the modified laser diode to generate light. Accordingly, the modified laser diode only generates light of this wavelength. Moreover, ECL 10 is structured such that, at the given angle of rotation of the tuning mirror about the pivot, the optical path length of optical cavity 13 is an integral multiple of the selected wavelength, so that the return beam, after reflection by the reflective back facet 18 of the modified laser diode, will be in phase with the emitted beam emitted by the modified laser diode.

For a given pitch $p_g$ of diffraction grating 14 and a given angle of incidence $\theta_I$ of incident beam portion 20 on the diffraction grating, the wavelength $\lambda$ at which the diffraction angle $\theta_D$ is such that the angle of incidence on reflecting surface 17 is zero is given by the following relationship:

$$\lambda = p_g[\sin \theta_D + \sin \theta_I],$$

where the pitch $p_g$ is the distance between corresponding points on adjacent grooves in diffracting surface 15.

To provide continuous wavelength tuning without the number of wavelengths in optical cavity 13 changing, tangents to the diffracting surface 15 of diffraction grating 14, the reflective surface 17 of tuning mirror 16, and the reflective rear facet 18 of modified laser diode 11 should intersect at pivot 30, as shown in FIG. 1. To meet this condition, as ECL 10 is tuned, the arm (not shown) on which the tuning mirror is mounted is rotated about pivot 30 so that the tangent to the reflecting surface always passes through the pivot. A change in the number of wavelengths in the optical cavity that occurs as an ECL is tuned is known in the art as a mode hop.

In practice, a Littman ECL, such as ECL 10 shown in FIG. 1, only provides continuous wavelength tuning without mode hops when the index of refraction is homogeneous throughout the external cavity 13. In a practical embodiment, the external cavity contains elements with different indices of refraction. Specifically, the refractive index of the semiconductor portion of modified laser diode 11 is typically about 3.5 and the index of refraction of converging lens 12 is about 1.5. Air, a gas or a vacuum, each with a refractive index of approximately unity, constitutes the remainder of the optical path. To provide continuous tuning without mode hops, an additional mechanism (not shown) is provided to adjust the position of the modified laser diode and the converging lens along the path of incident beam portion 20 to compensate for the regions of different refractive index in the optical path. With adjustment of the modified laser diode and the converging lens, and the above-described arrangement of the diffracting surface 15 of diffraction grating 14, the reflecting surface 17 of tuning mirror 16 and pivot 30, continuous wavelength tuning without mode hops can be obtained.

For ECL 10 to lase, the return beam must return to the active area of modified laser diode 11. The active area is small, typically about 1.5 µm wide by 1 µm high at the front surface of the modified laser diode. The ability of the return beam to return to the active area of the modified laser diode is characterized by the angle of incidence of diffracted beam portion 22 on the reflective surface 17 of tuning minor 16. Light that is incident on the reflective surface with an angle of incidence of zero will return to the active region of the modified laser diode.

The angle of incidence of diffracted beam portion 22 on reflective surface 17 can be regarded as having two orthogonal components, a yaw component and a pitch component. The yaw component is the component of the angle of incidence in the plane in which diffraction grating 14 diffracts the light emitted by modified laser diode 11 and the pitch component is orthogonal to the yaw component. Component alignment and other errors that affect the yaw component of the angle of incidence merely change the wavelength of the light generated by ECL 10 at a given angle of rotation of tuning mirror 16 about pivot 30.

Component alignment and other errors that result in the angle of incidence having a non-zero pitch component have more serious consequences, however. When the pitch component of the angle of incidence exceeds a threshold value, the focused return beam will not return fully to the active area of modified laser diode 11. This increases the threshold current of the ECL. When the value of the pitch component of the angle of incidence exceeds a critical value, greater than the threshold value and typically about 0.005 mrad, the ECL will no longer lase.

Tunable ECLs of the type just described typically incorporate a folding mirror to eliminate mechanical interference between the housing in which modified laser diode 11 is mounted and the pivot bearing of the arm on which tuning mirror 16 is mounted. Incorporating a folding mirror may also allow the physical size of the tunable ECL to be reduced. However, errors in the alignment of the folding mirror can increase the variability of the pitch component of the angle of incidence. The need to accurately align the folding mirror further increases the difficulty of aligning and manufacturing the ECL.

Thus, what is needed is a tunable ECL having a simplified adjustment.

SUMMARY OF THE INVENTION

The invention provides an adjustable mount for optical components. The mount includes a base, a main body and a hinge. The hinge couples the main body to the base. The main body is bounded in part by two plane external surfaces orthogonal to a common reference plane and angularly separated from one another by an angle. The hinge is located opposite the angle and parallel to the reference plane.

A folding mirror may be mounted on the mount with its reflective surface in contact with one of the external surfaces, and a diffraction grating may be mounted on the mount with its diffracting surface in contact with the other of the external surfaces. The resulting assembly may be incorporated into an external-cavity laser. In the external-cavity laser, the mount provides a single, differential adjustment of the pitch component of the angle of incidence of light on the tuning mirror of the laser. The adjustment provided by the mount eliminates the need to provide individual precision adjustments for the modified laser device, the tuning mirror, the diffraction grating and the folding mirror and the need to individually align these optical elements during production. Fabricating the laser is substantially simplified and reduced in cost as a result.

The invention also provides a tunable external-cavity laser that includes a mount, a light source, a converging lens located to receive light from the light source, a tuning mirror and a pivoting arm on which the tuning mirror is mounted. The mount includes a base, a main body, a reflecting surface, a diffracting surface and a hinge coupling the main body to the base. The main body is bounded in part by two plane external surfaces orthogonal to a common reference plane and angularly separated from one another by an angle. The reflecting surface has a spatial orientation defined by one of the external surfaces and is arranged to receive collimated light from the lens. The diffracting surface has a spatial orientation defined by the other of the external surfaces, and diffracts light received from the reflecting surface towards the tuning mirror. The hinge is located opposite the angle and parallel to the reference plane.

In an embodiment, at least part of one of the external surfaces constitutes the reflecting surface. Additionally or alternatively, at least part of the other of the external surfaces constitutes the diffracting surface.

Another embodiment additionally includes a folding mirror and a diffraction grating. The folding mirror includes the reflecting surface and is mounted on the main body with the reflecting surface in contact with the one of the external surfaces. The diffraction grating includes the diffracting surface and is mounted on the main body with the diffracting surface in contact with the other of the external surfaces.

The invention also provides a method for aligning an external-cavity laser. In the method, a mount is provided that includes a main body bounded in part by two plane external surfaces orthogonal to a common reference plane and angularly separated from one another by an angle. A reflecting surface and a diffracting surface are additionally provided. The spatial orientation of the reflecting surface is defined by one of the external surfaces. The spatial orientation of the diffracting surface is defined by the other of the external surfaces. The main body is tilted about an axis disposed non-orthogonally to at least one of the external surfaces to differentially change the pitch angle of a light beam serially reflected by the reflecting surface and diffracted by the diffracting surface.

In an external-cavity laser, the mount provides an adjustment of the pitch component of the angle of incidence of light on the tuning mirror. Light incident on the tuning mirror with an angle of incidence whose pitch component is zero will fully return to the modified laser diode after reflection by the tuning mirror. The adjustment provided by the mount eliminates the need to provide individual precision adjustments for the modified laser device, the tuning mirror, the diffraction grating and the folding mirror and to individually align these optical elements during production. Fabricating the laser is substantially simplified and reduced in cost as a result.

BRIEF DESCRIPTION OF THE DRAWINGS

The invention can be better understood with reference to the following drawings. The components in the drawings are not necessarily to scale. Emphasis is instead placed upon clearly illustrating the invention. In the drawings, like reference numerals designate corresponding parts throughout the several views.

DETAILED DESCRIPTION OF THE INVENTION

Figure 1:
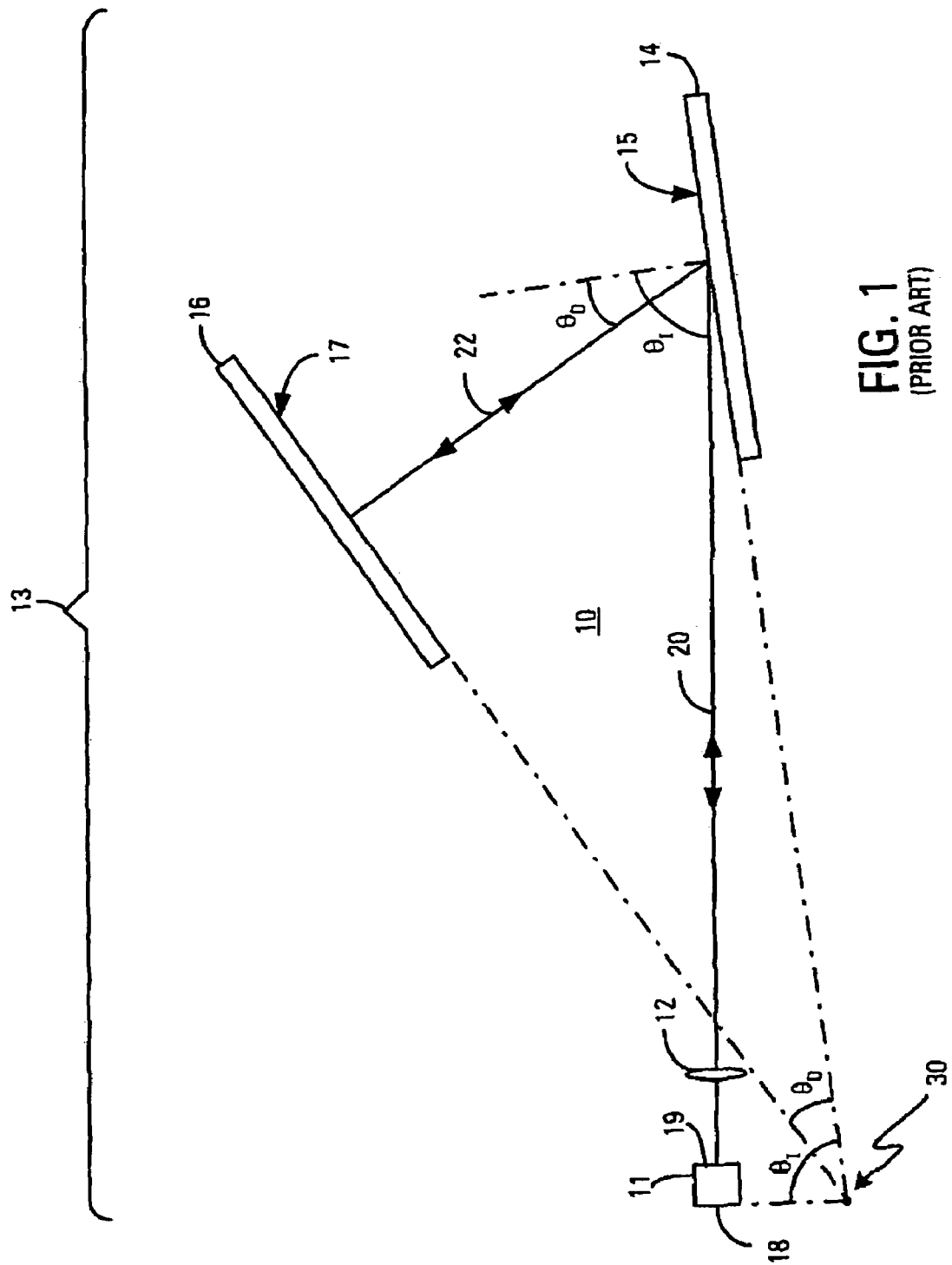
FIG. 1 is a schematic diagram of a prior art tunable external cavity laser.
Figure 2:
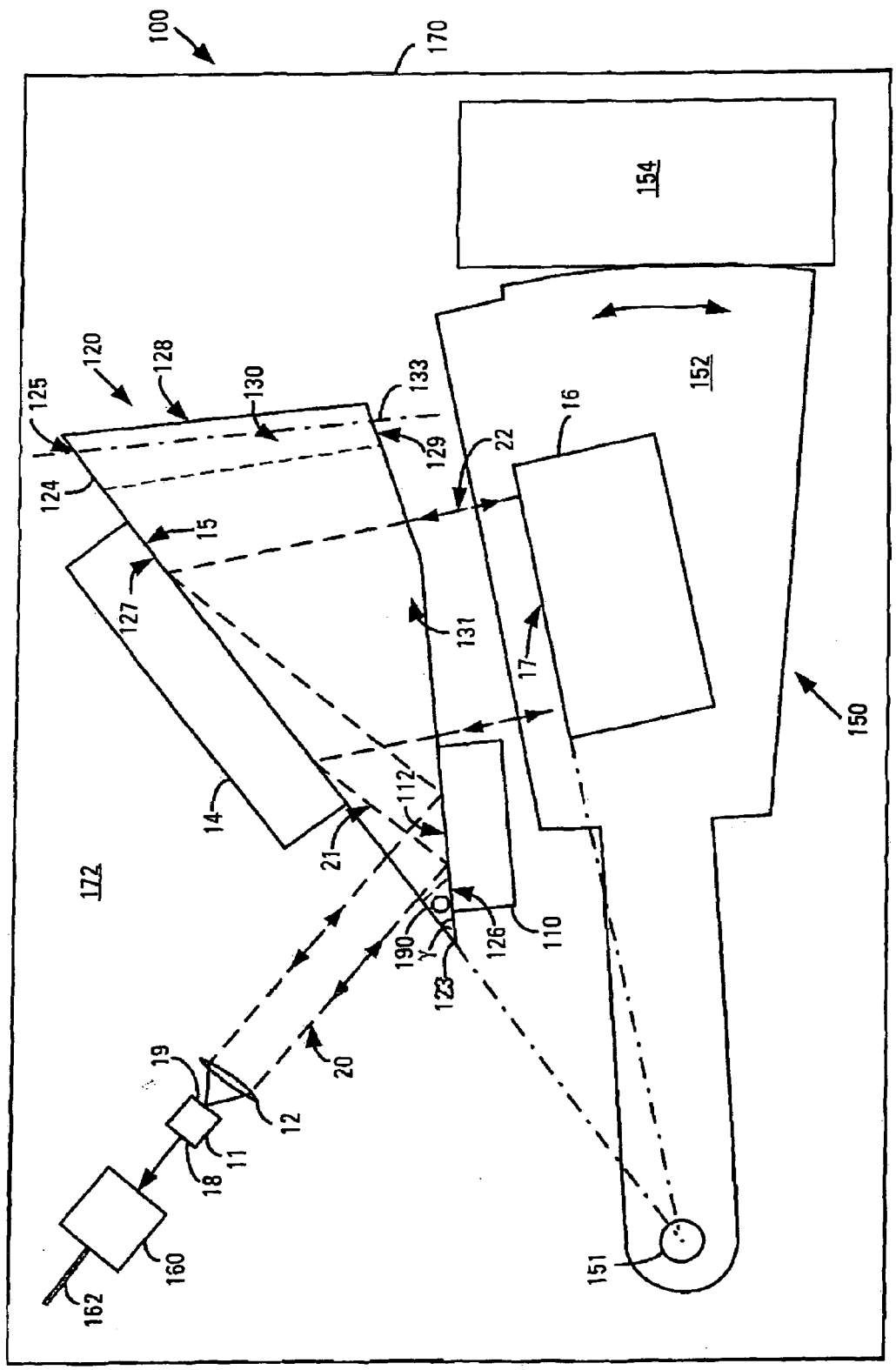
FIG. 2 is a plan view of an embodiment of a tunable ECL in accordance with the invention incorporating a first embodiment of a mount in accordance with the invention.

FIG. 2 is a plan view of an embodiment 100 of a miniaturized tunable ECL in accordance with the invention. The tunable ECL is based on the Littman-based ECL described above with reference to FIG. 1. The tunable ECL includes a folding mirror that eliminates mechanical interference between the housing in which the modified laser diode is mounted and the pivot bearing of the arm on which the tuning mirror is mounted. The folding mirror may additionally reduce the overall size of the ECL.

Tunable ECL 100 incorporates a mount that supports the folding mirror and the diffraction grating in a defined spatial relationship with one another. The mount also provides a single, differential adjustment of the pitch component of the angle of incidence of the light diffracted by the diffraction grating on the tuning mirror. The adjustment provided by the mount eliminates the need to provide individual precision adjustments for the modified laser device, the tuning mirror, the diffraction grating and the folding mirror and to individually align these optical elements during production. The adjustment sets the pitch component of the angle of incidence on the tuning mirror to zero so that the return beam reflected by the tuning mirror returns to the modified laser diode along a path that is substantially the reciprocal of the path of the emitted beam emitted by the modified laser device. As a result, the light emitted by the modified laser device substantially fully returns to the active area of the modified laser device after reflection by the tuning mirror. This enables the ECL to lase at a low threshold current. The adjustment of the pitch component of the angle of incidence provided by one embodiment of the mount has a range of about 17 milliradians (mrad), i.e., about one degree, and has a precision of about 0.005 mrad.

ECL 100 is composed of the following elements arranged along a Z-shaped optical path: modified laser diode 11, converging lens 12, a folding mirror 110, diffraction grating 14 and tuning mirror 16. The ECL is additionally composed of a first embodiment 120 of a mount according to the invention, a tuning mechanism 150, an output coupler 160 and a base plate 170.

Modified laser diode 11, converging lens 12, mount 120 and tuning mechanism 150 are mounted on base plate 170. In the example shown, the base plate has a plane major surface 172. However, it is not critical to the invention that the base plate have a plane major surface. A laser reference plane can be substituted for major surface 172 in the following description in embodiments in which the base plate lacks a plane major surface.

Modified laser diode 11 serves as the optical gain medium of ECL 100. The modified laser diode has a partially-reflective rear facet 18. Rear facet 18 and the reflective surface 17 of tuning mirror 16 define opposite ends of the optical cavity of ECL 100. Part of the light generated by ECL 100 is output through partially-reflective facet 18 to an output coupler 160. Front facet 19 of the modified laser diode is coated with an anti-reflection coating.

Modified laser diode 11 is mounted on base plate 170 with partially-reflective facet 18 nominally orthogonal to major surface 172. With this orientation of the partially-reflective facet, the modified laser diode emits first beam portion 20 in a direction nominally parallel to major surface 172. In this disclosure, the term "nominally" is used to denote a parameter that is within the range that can be adjusted by adjusting mount 120, as will be described below. In practice, components described as being nominally parallel or nominally orthogonal are parallel or orthogonal, respectively, to within a tenth or a few tenths of a degree (a few mrad, approximately). Such an alignment precision can be obtained using fixed mountings or simple, adjustable mountings. This is in comparison to the precision with which such components would need to be aligned to make the pitch component of the angle of incidence on the tuning mirror less than approximately 0.005 mrad, as described above, in an ECL without mount 120.

Tuning mechanism 150 is composed of a pivot 151, an arm 152 and an actuator. The actuator is shown schematically at 154. The pivot extends orthogonally from the major surface 172 of base plate 170. One end of the arm is mounted on the pivot. The other end of the arm engages with or is otherwise coupled to the actuator. The actuator rotates the arm about the pivot in a plane parallel to the major surface. The arm can alternatively be pivotally mounted on the base plate by a structure different from pivot 151, and the actuator may be coupled to the arm at a location different from that shown. Tuning mirror 16 is mounted on the arm at a point remote from the pivot with reflective surface 17 nominally orthogonal to the major surface of the arm and, hence, to major surface 172.

Output coupler 160 is mounted on base plate 170 to receive light output through the partially-reflective facet 18 of modified laser diode 11. The output coupler couples the light received from the modified laser diode into an optical fiber 162, for example, as the output light of ECL 100.

Diffraction grating 14 and folding mirror 110 are mounted on mount 120 in a defined spatial relationship to one another. Specifically, the mount defines the angle between the reflecting surface 112 of the folding mirror and the diffracting surface 15 of the diffraction grating. Additionally, the mount sets both the reflecting surface and the diffracting surface nominally orthogonal to a common reference plane, as will be described in more detail below.

Mount 120 is mounted on base plate 170 positioned and oriented such that folding mirror 110 receives first beam portion 20 from converging lens 12 at such an angle of incidence that a second beam portion 21 reflected by the folding mirror is incident on diffraction grating 14. The position and orientation of the mount are additionally such that third beam portion 22 diffracted by the diffraction grating is incident on tuning mirror 16 over the tuning range provided by tuning mechanism 150.

Figure 4:
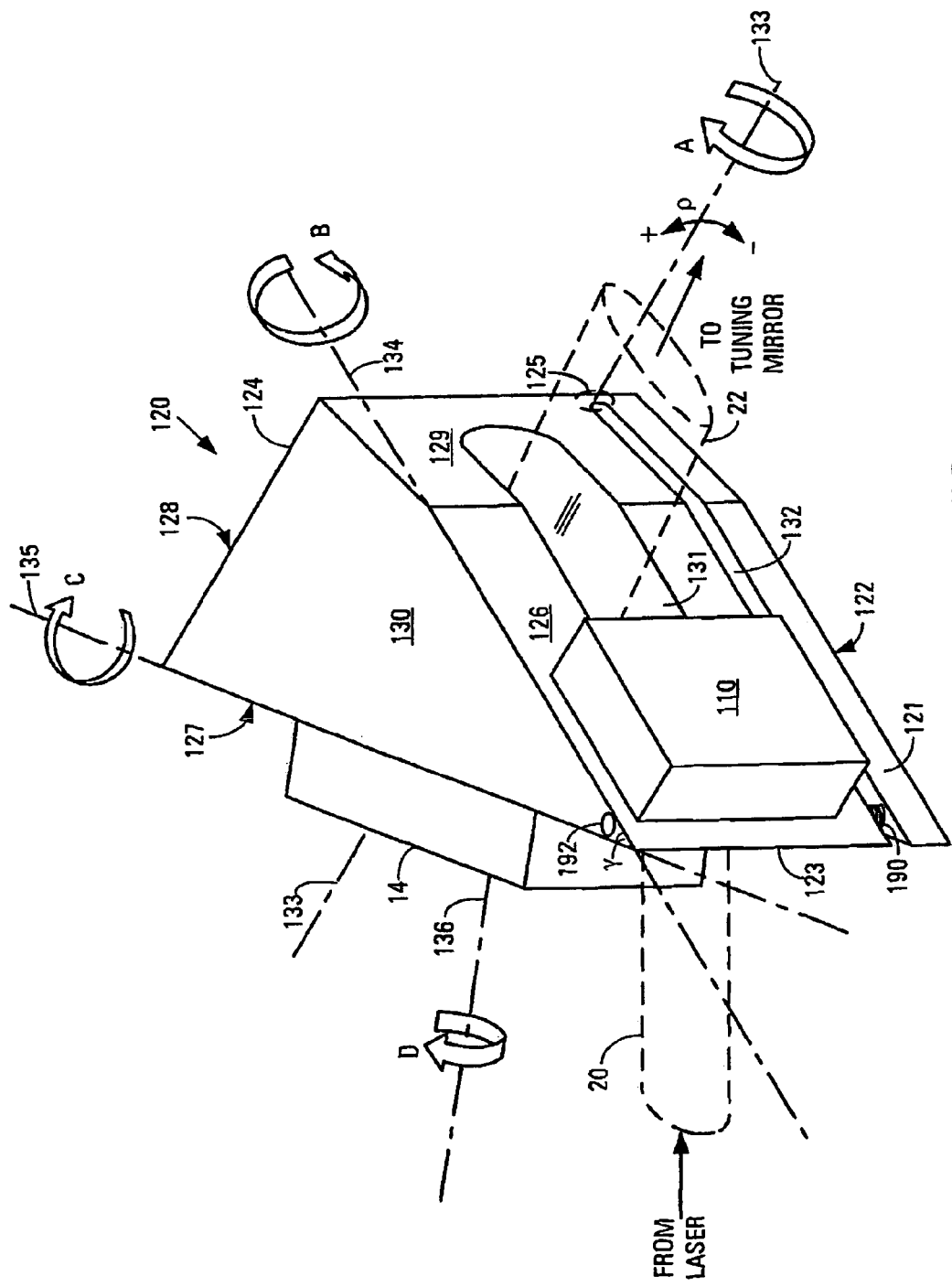
FIG. 4 is an isometric view of the mount shown in FIG. 2.
Figure 5:
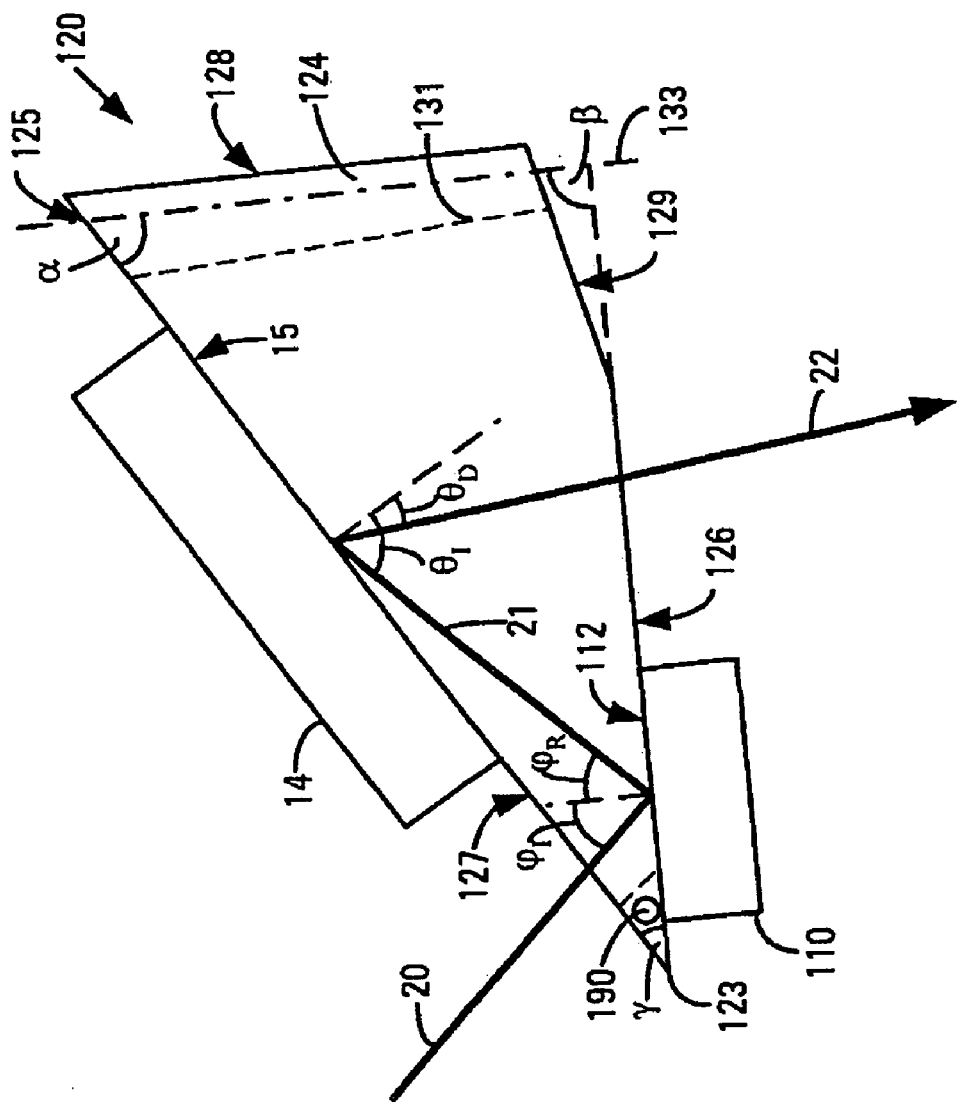
FIG. 5 is a plan view of the mount shown in FIG. 2 showing the path of light through the mount.
Figure 6:
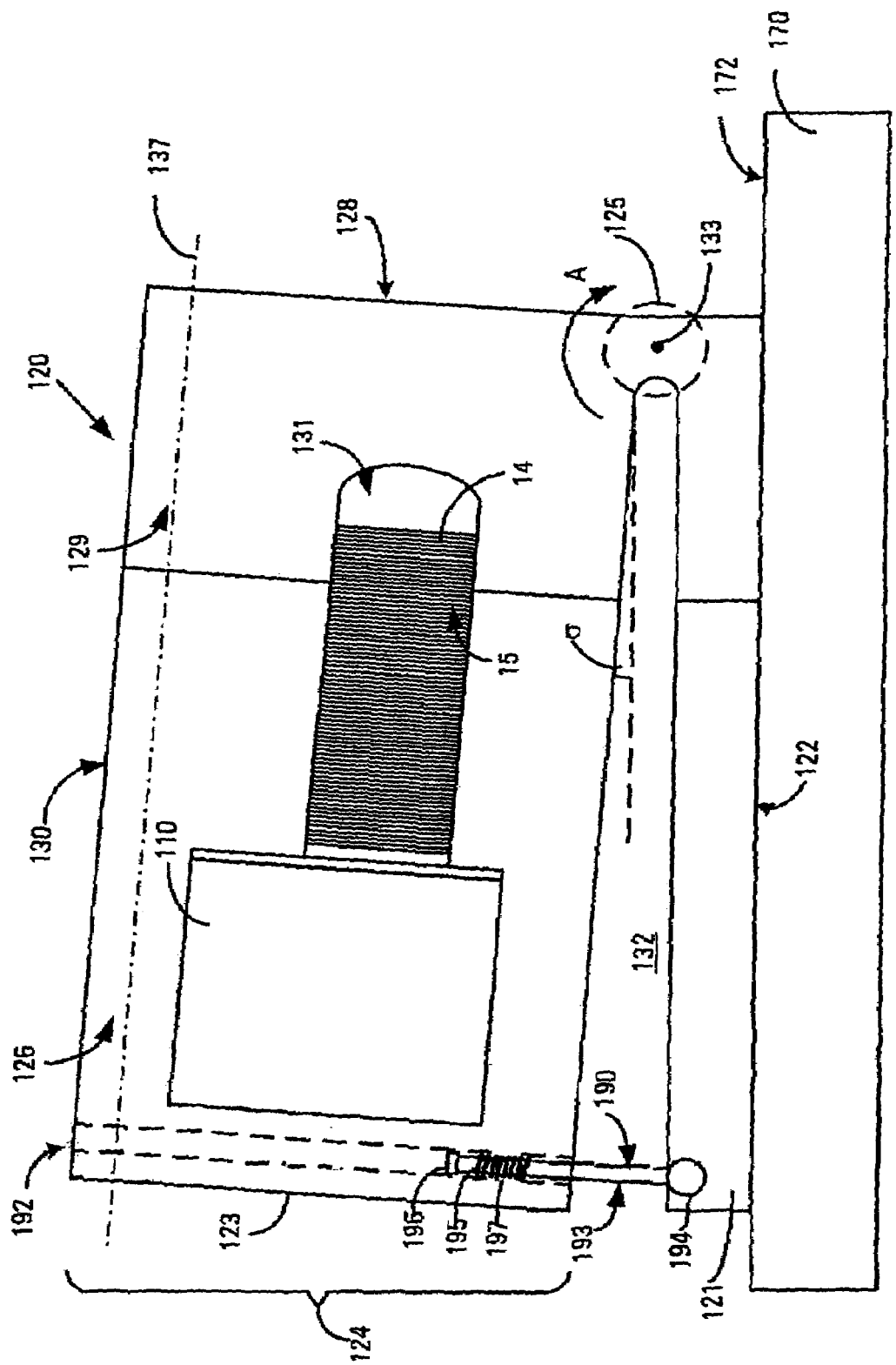
FIG. 6 is a side elevation of the mount shown in FIG. 2 and illustrates an exemplary embodiment of the adjustment mechanism of the mount.

FIGS. 3-6 show ECL 100 and mount 120 in more detail. Turning first to FIG. 6, mount 120 is composed of a base 121, a main body 124, a hinge 125 and an adjustment mechanism 190. The base includes an attachment surface 122 shaped to attach to the major surface 172 of base plate 170. In the example shown, in which major surface 172 is plane, attachment surface 122 is also plane. The main body is attached to the base by the hinge. Alternatively, base plate 170 may serve as base 121. In this case, main body 124 is attached directly to the base plate by the hinge and adjustment mechanism 190 tilts the main body about the hinge relative to the base plate. In another alternative, base 121 may be extended laterally to serve as base plate 170. Main body 124 and base 121 are shown as having the same shape in a plane parallel to major surface 172. However, this is not critical to the invention: main body 124 and base 121 may differ in shape in a plane parallel to major surface 172.

Figure 3:
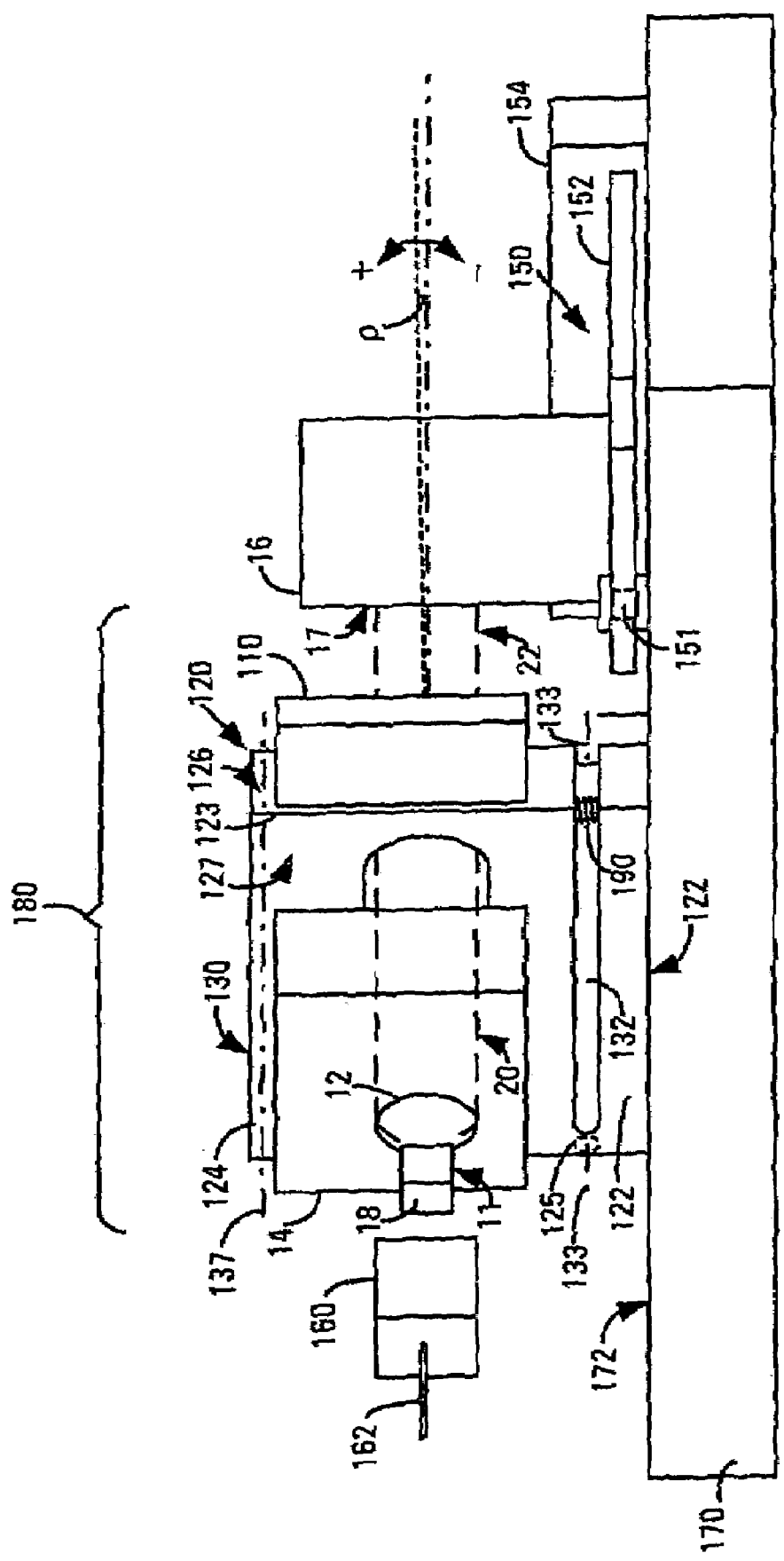
FIG. 3 is a side view of the tunable ECL shown in FIG. 2.

Referring now to FIGS. 2 and 3, main body 124 is bounded in part by two plane external surfaces 126 and 127, back surface 128 and top surface 130. External surfaces 126 and 127 are nominally orthogonal to a common reference plane and are angularly separated from one another by an angle γ at a vertex 123. The common reference plane is disposed parallel to hinge 125. The common reference plane is local to main body 124 and will be called main body reference plane 137. The main body reference plane is not necessarily parallel to major surface 172 because the main body can be tilted about the hinge relative to base plate 170.

Top surface 130 extends between external surfaces 126 and 127. In the example shown, the top surface is a plane surface disposed parallel to main body reference plane 127 and is thus also parallel to hinge 125. However, the top surface need not be plane. Nor need the top surface be disposed parallel to the main body reference plane. Back surface 128 is located opposite vertex 123. In the example shown, the back surface is parallel to the hinge, which defines a hinge axis 133.

Main body 124 is substantially wedge-shaped. The main body in the example shown differs from a pure wedge shape in that the vertex between back surface 128 and external surface 126 is truncated by surface 129. Truncating the vertex avoids interference between mount 120 and arm 152 as the latter rotates. In other embodiments, the vertex need not be truncated. The main body may additionally or alternatively differ from a pure wedge-shape by truncating or rounding vertex 123 between external surfaces 126 and 127.

Folding mirror 110 is mounted on main body 124 with reflecting surface 112 in contact with external surface 126. Diffraction grating 14 is mounted on the main body with diffracting surface 15 in contact with external surface 127 and with the grooves of the diffracting surface nominally orthogonal to main body reference plane 137. Mounting folding mirror 110 with reflecting surface 112 in contact with external surface 126 and mounting diffraction grating 14 with diffracting surface 15 in contact with external surface 127 defines relationships between the reflecting surface of the folding mirror and the diffracting surface of the diffraction grating corresponding to those between the external surfaces. In particular, the angle γ between the external surfaces defines the angle between the reflecting surface and the diffracting surface and the orthogonal relationship between the external surfaces and main body reference plane 137 sets both the reflecting surface and the diffracting surface orthogonal to the main body reference plane.

Moreover, mounting folding mirror 110 with the reflecting surface 112 in contact with external surface 126 also eliminates tolerances due to variations in the thickness of the substrate of the folding mirror and variations in the angle between the reflecting surface and the surface of the substrate of the folding mirror. Similar advantages accrue from mounting diffraction grating 14 with diffracting surface 15 in contact with external surface 127.

Main body 124 is configured to allow light to reach reflecting surface 112 from modified laser diode 11, to pass between reflecting surface 112 and diffracting surface 15 and to pass from diffracting surface 15 to tuning mirror 16. In the example of mount 120 shown in FIGS. 2-6, the main body 124 defines access aperture 131 that extends through the main body between external surface 126 and external surface 127. The access aperture allows first beam portion 20 directed by converging lens 12 towards external surface 127 to pass through the main body to the reflecting surface 112 of folding mirror 110. The access aperture additionally allows second beam portion 21 to pass through the main body from reflecting surface 112 to the diffracting surface 15 of diffraction grating 14. Finally, the access aperture allows third beam portion 22 to pass through the main body from diffracting surface 15 to exit through external surface 126 and surface 129 towards tuning mirror 16. Other embodiments of the main body are configured differently to allow light to pass between the reflecting surface and the diffracting surface, as will be described below.

Mount 120 additionally includes an adjustment mechanism 190 operable to tilt main body 124 about hinge 125 with respect to base 121. Tilting the main body about the hinge in turn tilts folding mirror 110 and diffraction grating 14 about the hinge axis. As will be described in more detail below, the geometry of the main body causes the tilting of the folding mirror and the diffraction grating about the hinge axis to differentially change the pitch angle ρ of third beam portion 22. Changing the pitch angle of the third beam portion changes the pitch component of the angle of incidence of the third beam portion on tuning mirror 16. The adjustment mechanism is operated to adjust the pitch angle to make the third beam portion incident on the tuning mirror at an angle of incidence having a pitch component of zero. Light incident on the tuning mirror at an angle of incidence having a pitch component of zero will fully return to the active area of modified laser diode 11 along a path that is the reciprocal of that of the emitted beam.

The example of mount 120 shown has adjustment mechanism 190 located near vertex 123 at which external surfaces 126 and 127 intersect and has hinge 125 located adjacent back surface 128, remote from the adjustment mechanism. The adjustment mechanism and the hinge may be located in different places from those illustrated. However, increasing the distance between the adjustment mechanism and the hinge reduces the sensitivity of the adjustment provided by the adjustment mechanism. Reducing the sensitivity of the adjustment is generally desirable.

Modified laser diode 11 generates light that it emits towards converging lens 12. The converging lens collimates the light to form first beam portion 20 that is incident on the reflecting surface 112 of folding mirror 110. The folding mirror reflects the first beam portion as second beam portion 21. The second beam portion is incident on diffracting surface 15 of diffraction grating 14. The diffraction grating diffracts the second beam portion as third beam portion 22. At the wavelength at which ECL 100 lases, the third beam portion is incident on the reflective surface 17 of tuning mirror 16 at an angle of incidence having a yaw component of zero. Reflective surface 17 reflects the light received from the diffraction grating back along the paths of third beam portion 22, second beam portion 21 and first beam portion 20 to the converging lens, which focuses the return beam on the modified laser diode.

Rotating arm 152 about pivot 151 changes the angle of the reflective surface 17 of tuning mirror 16 relative to the diffracting surface 15 of diffraction grating 14 and additionally changes the optical path length of the optical cavity to select the wavelength at which the optical cavity is resonant. In the example shown in FIG. 2, clockwise rotation of the arm about the pivot increases the optical path length of the optical cavity and increases the angle of diffraction at which the diffracted light is incident on the tuning mirror with an angle of incidence of zero. Conversely, counter-clockwise rotation of the arm decreases the optical path length of the optical cavity and decreases the angle of diffraction at which the diffracted light is incident on the tuning mirror with an angle of incidence of zero. With the appropriate geometry, rotating tuning mirror 16 on arm 152 about pivot 151 simultaneously changes (a) the angle of diffraction of the light normally incident on the tuning mirror (and, hence, wavelength of the light returned to the modified laser diode), and (b) the optical path length of the optical cavity. The optical path length changes in a manner that maintains the same number of wavelengths in the optical cavity as ECL 100 is tuned, i.e., in a manner that prevents mode hops as the ECL is tuned.

FIGS. 3 and 4 show the pitch angle ρ of third beam portion 22 exiting mount 120. The pitch angle is the difference in angle between the direction of the third beam portion and a plane parallel to major surface 172 of base plate 170. The difference between the pitch angle and the direction of the normal to the reflective surface 17 of tuning mirror 16 determines the pitch component of the angle of incidence of the third beam portion of the reflective surface. When the pitch angle ρ exceeds a threshold value, the light emitted by modified laser diode 11 and reflected by reflective surface 17 will not fully return to the active area of the modified laser diode. This increases the threshold current of ECL 100. When the value of the pitch angle exceeds a critical value, greater than the threshold value, the ECL will no longer lase.

Turning now to FIG. 4, which is an isometric view of mount 120, and referring additionally to FIG. 5, first beam portion 20 and third beam portion 22 are visible, and second beam portion 21 is concealed by folding mirror 110 and the main body 124 of the mount. Access aperture 131 is shaped to enable light to pass through main body 124 to and from the folding mirror and diffraction grating 14 and between the folding mirror and the diffraction grating. The access aperture also operates as a spatial mode suppression aperture that defines the width of the beam portions as they pass through the main body. Defining the width of the beam portions suppresses unwanted spatial modes that might otherwise occur in the modified laser diode.

Main body 124 is bounded in part by external surface 126 and external surface 127. In the example shown, the external surfaces intersect at vertex 123. However, external surfaces 126 and 127 need not intersect at a real vertex, or at all.

Folding mirror 110 is mounted on external surface 126 with its reflecting surface 112 in contact therewith. Diffraction grating 14 is mounted on external surface 127 with its diffracting surface 15 in contact therewith. The angle γ between external surface 126 and external surface 127 defines the angle between the reflecting surface of the folding mirror and the diffracting surface of the diffraction grating.

FIGS. 2-6 show an exemplary embodiment of mount 120 fabricated from a single piece of material. Base 121 and main body 124 collectively define a slot 132 that extends from vertex 123 towards hinge 125 through a substantial portion of the mount. The slot leaves the main body connected to the base by a narrow strip of material that constitutes hinge 125. The material of the hinge bends to allow the main body to tilt about hinge axis 133. The base, the main body and the hinge may alternatively be separate components arranged with the hinge connecting the main body to the base. Additionally or alternatively, the hinge may include a hinge element (not shown) that pivots relative to another hinge element (not shown) as the main body tilts relative to the base.

FIG. 6 shows an example of adjustment mechanism 190 that is operable to tilt main body 124, together with folding mirror 110 and diffraction grating 14, about hinge 125. In the example shown, the adjustment mechanism includes a screw 193 that controllably translates a portion of main body 124 offset from hinge 125 to tilt the main body about the hinge. The screw includes a non-threaded engaging portion 194 at or adjacent one end thereof, a threaded portion 195 that extends at least part-way along the length of the screw, and a head 196. The engaging portion is rotationally engaged with base 121 in a manner that constrains axial movement of the screw. The threaded portion engages with a thread 197 formed in main body 124. The head is accessible through opening 192. A screwdriver, Allen wrench or other suitable tool (not shown) inserted into opening 192 to engage with head 196 rotates the screw to move the engaging portion of the main body along the length of the screw. The offset between the adjustment mechanism and hinge 125 translates the movement of thread 197 along the length of the screw into tilting of the main body. After adjustment mechanism 190 has been used to adjust ECL 100, it is locked by, for example, a suitable adhesive to fix the adjustment.

Other mechanisms for controllably tilting a body about a hinge are known in the art and may be used instead of the screw adjustment mechanism described above. For example, a jack mechanism can be located in slot 132 at a point offset from hinge 125 to control the width of the slot. In another example, a wedge can be inserted into the slot at a point offset from the hinge to control the width of the slot and thereby tilt the main body about the hinge. In embodiments in which the adjustment is performed by a unidirectional device such as a jack or a wedge, the main body includes a biasing mechanism that biases the main body towards a closed position of the slot. In embodiments in which the hinge includes one hinge element that pivots relative to another as the main body tilts about the hinge, the adjustment mechanism preferably includes an anti-backlash mechanism.

Mount 120 is fabricated from stainless steel, brass, glass, plastic or another suitable material. The material is processed by one or more of casting, molding, machining, sawing, milling, grinding and/or other processes to define the shape of the mount. The example shown is a monolithic structure in which base 121, hinge 125 and main body 124 are defined by forming slot 132 in a single, shaped piece of material. However, this is not critical to the invention: the mount may be made by assembling individual components constituting the main body, the hinge and the base. In embodiments in which hinge 125 allows the main body to tilt by flexing rather than by relative pivoting motion of one hinge element relative to another, at least the portion of mount 120 constituting the hinge is fabricated of a material capable of flexing elastically without yielding or cracking. Moreover, main body 124 may be made by assembling components. However, the precise relative alignment of folding mirror 110 and diffraction grating 14 is ensured by external surfaces 126 and 127 being surfaces of the same component of the main body.

The choice of materials and the manufacturing process for mount 120 depends on such factors as manufacturing cost and volume, the alignment precision required and the temperature range over which the alignment precision is to be maintained. Molded metals or plastics have a low manufacturing cost, and the alignment precision can be defined by the precision of the mold. Thermal expansion may limit the temperature range over which a given alignment precision is maintained with these materials. The mount has the advantage that external surfaces 126 and 127 are external and can therefore easily be formed by molding or by machining or grinding less-accurately aligned surfaces to provide a desired precision of the spatial orientations of the reflecting surface and the diffracting surface defined by the external surfaces.

In embodiments intended for operation over a wide temperature range, the material of main body 124 should have a low coefficient of thermal expansion to maintain the spatial orientations of reflecting surface 112 and the diffracting surface 15 over the temperature range. Low CTE metals, such as invar, are suitable, as are low CTE glasses such as Zerodur® glass-ceramic sold by Schott Corp., Yonkers, N.Y. 10701.

Access aperture 131, slot 132 and opening 192 can be formed by machining, by molding or by some other suitable process or processes.

Not all of the reflecting surface 112 of folding mirror 110 mounted in contact with external surface 126 need be reflective. Only a region larger than the portion of the reflecting surface illuminated by first beam portion 20 need be reflective. Nor need all of the diffracting surface 15 of diffraction grating 14 mounted in contact with external surface 127 be diffractive. Only a region larger than the portion of the diffracting surface illuminated by second beam portion 21 need be diffractive. The portions of the reflecting surface and the diffracting surface that contact external surfaces 126 and 127, respectively, may be non-reflective and ungrooved, respectively.

As noted above, the external surfaces 126 and 127 of the main body 124 of mount 120 define respective spatial orientations of the reflecting surface 112 of folding mirror 110 and the diffracting surface 15 of diffraction grating 14. When the mount 120 is mounted on base plate 170, the mount 120 additionally defines the positions of reflecting surface 112 and diffracting surface 15 with respect to the components that constitute the remainder of ECL 100, i.e., modified laser diode 11, converging lens 12 and arm 152 on which tuning mirror 16 is mounted. Adjustment mechanism 190 tilts the main body of the mount about hinge 125 to tilt the folding mirror and the diffraction grating together about the hinge to differentially adjust the pitch angle ρ of third beam portion 22, as shown in FIG. 3. The pitch angle ρ is 0° when the third beam portion is parallel to major surface 172, is positive when the third beam portion diverges from the major surface and is negative when the third beam portion converges on the major surface.

FIG. 5 is a plan view of mount 120 showing more details of the geometry of the main body 124 of the mount, and additionally showing the path of the light emitted by modified laser diode 11 as it passes through the mount. Light returning to the modified laser diode after reflection by the tuning mirror is omitted to simplify the drawing. The geometry of main body 124 is defined in part by base angles α and β and vertex angle γ. Base angles α and β are the angles between external surface 127 and external surface 126, respectively, and hinge axis 133 measured in the plane of main body reference plane 137 (FIG. 3). Back surface 128 is parallel to the hinge axis in the example shown, but it is not critical that it be so. The external surfaces are additionally both orthogonal to the plane of the main body reference plane, as noted above. Vertex angle γ is the angle between the external surfaces in the main body reference plane. Angle γ and the orthogonality of both external surfaces to the main body reference plane define the spatial relationship between the reflecting surface 112 of folding mirror 110 and the diffracting surface 15 of diffraction grating 14.

FIG. 6 shows mount 120 with main body 124 tilted in direction A about hinge axis 133 at a tilt angle σ. The tilt angle is the angle between main body reference plane 137 and a plane parallel to the major surface 172 of base plate 170. The tilt angle is exaggerated in FIG. 6 to enable it to be shown clearly.

Referring now to FIGS. 4 and 5, the effect of tilting main body 124 in direction A about hinge axis 133, i.e., clockwise about the hinge axis looking towards external surface 126, will now be described. Tilting the main body about the hinge axis tilts external surface 126 and, hence, folding mirror 110, about the hinge axis. In embodiments of the main body in which external surface 126 is at an acute angle to the hinge axis (base angle β<90°), the tilt of the folding mirror has a component in direction B about axis 134 that changes the pitch component of the angle of incidence $\phi_I$ of first beam component 20 on reflecting surface 112. Tilting the main body about the hinge axis additionally tilts external surface 127 and, hence, diffraction grating 14, about the hinge axis. Tilting external surface 127 rotates the grooves of the diffracting surface 15 of the diffraction grating in direction D about axis 136, which is local to the diffraction grating. Additionally, in embodiments in which external surface 127 is at an acute angle to the hinge axis (base angle α<90°), the tilt of the diffraction grating has a component in direction C about axis 135 that changes the pitch component of the angle of incidence $\theta_I$ of first beam portion 21 on diffracting surface 15.

In an embodiment in which base angle α=90°, external surface 127 is orthogonal to hinge axis 133, and tilting main body 124 about the hinge axis insignificantly changes the pitch component of the angle of incidence $\theta_I$ of second beam portion 21 on diffracting surface 15. However, in such embodiment, tilting the main body about the hinge axis still rotates the grooves on diffracting surface 15 about axis 136. In an embodiment in which base angle β=90°, external surface 126 is orthogonal to the hinge axis, and tilting the main body about the hinge axis does not change the pitch component of the angle of incidence $\phi_I$ of first beam portion 20 on reflecting surface 112.

In an embodiment in which base angles α and β are both acute, tilting main body 124 in direction A about hinge axis 133 causes both the reflecting surface 112 of folding mirror 110 and reflection at the diffracting surface 15 of diffraction grating 14 to deflect the third beam portion 22 towards base plate 170. In addition, tilting main body 124 in direction A about hinge axis 133 rotates the grooves in diffracting surface 15 relative to second beam portion 21. This causes the diffraction grating to diffract third beam portion 22 away from the base plate. The two opposing effects on the third beam portion combine linearly for small pitch angles. As a result, tilting main body 124 in direction A about the hinge axis deflects third beam portion 22 away from the base plate by an amount less than the deflection caused the rotation of the direction of the grooves in the diffracting surface about axis 136. The differential effect just described allows the mount 120 to be used to make very fine adjustments to the pitch angle ρ of the third beam portion exiting the mount. Embodiments of mount 120 in which only one of base angle α and base angle β is acute also differentially deflect the third beam portion, although the contributions of the three components contributing to the change in pitch angle are different from that just described.

The differential effect on pitch angle ρ of tilting the main body 124 of mount 120 in direction A about hinge axis 133 will now be further described with reference to FIGS. 4, 5 and 6. FIG. 5 shows the path of the emitted light emitted by modified laser diode 11 (FIG. 2). Angles of incidence, reflection, and diffraction are all measured relative to the normal to the surface of the respective optical element at the point of incidence. First beam portion 20 is incident on the reflecting surface 112 of folding mirror 110 at an angle of incidence $\phi_I$ and is reflected by the reflecting surface at angle of reflection $\phi_R(=\phi_I)$ as second beam portion 21. The second beam portion is incident on the diffracting surface 15 of diffraction grating 14 at an angle of incidence $\theta_I$ and is diffracted by the diffracting surface at an angle of diffraction $\theta_D$ as third beam portion 22. The third beam portion is incident on the reflective surface 17 of tuning mirror 16 (FIG. 2).

The change Δρ in the pitch angle ρ (FIG. 4) of third beam portion 22 resulting from a change Δσ in the tilt angle σ (FIG. 6) of main body 124 about hinge axis 133 is given by equation (1):

$$\Delta\rho=[-(\cos\phi_I+\cos\phi_R)\cos\beta-(\cos\theta_I+\cos\theta_D)\cos\alpha+(\sin\theta_I+\sin\theta_D)\sin\alpha]\Delta\sigma \quad (1)$$

Inspection of equation (1) shows that the change in the pitch angle has three components that will be called $\Delta\rho_1$, $\Delta\rho_2$ and $\Delta\rho_3$.

The components of the change Δρ in the pitch angle of third beam portion 22 caused by tilting main body 124 in direction A about hinge axis 133 will now be described in more detail with reference to an example in which the light generated by modified laser diode 11 and selected by tuning mirror 16 has a wavelength λ and diffraction grating 14 has a pitch $p_g$. As noted above, a positive value of pitch angle ρ denotes divergence of third beam portion 22 from major surface 172 and a negative value of the pitch angle denotes convergence of the third beam portion and major surface 172.

Referring now to FIG. 4 and additionally referring to FIG. 5, tilting main body 124 in direction A about hinge axis 133 tilts the reflecting surface 112 of folding mirror 110 and the diffracting surface 15 of diffraction grating 14 in the same direction about hinge axis 133. In an embodiment in which external surface 126 is at an acute angle to the hinge axis, the tilt of the folding mirror about the hinge axis has a component in direction B about axis 134. Additionally or alternatively, in an embodiment in which external surface 127 is at an acute angle to the hinge axis, the tilt of diffracting surface 15 about the hinge axis has a component in direction C about axis 135. Regardless of the angle of external surface 127 to the hinge axis, the tilt of the diffracting surface about the hinge axis rotates the grooves of the diffracting surface in direction D about axis 136.

Component $\Delta\rho_1$ of the change in the pitch angle of third beam portion 22 resulting from tilting main body 124 through an angle $\Delta\sigma$ in direction A about hinge axis 133 decreases pitch angle $\rho$. Component $\Delta\rho_1$ is contributed by reflecting surface 112 tilting in direction B about axis 134, and is given by:

$$\Delta\rho_1 = (\cos\phi_I + \cos\phi_R) \times (\cos\beta) \times \Delta\sigma \quad (2)$$

For example, in an embodiment in which the angle of incidence $\phi_I$ on reflecting surface 112 is 45° and in which base angle $\beta$ of main body 124 is 80°, for a change of 1° in direction A in the tilt of main body 124 about hinge axis 133 ($\Delta\sigma=1°$), component $\Delta\rho_1$ determined by equation (2) is a decrease of approximately 0.245° in the pitch angle. In an embodiment of main body 124 in which base angle $\beta=90°$, component $\Delta\rho_1$ is zero.

Component $\Delta\rho_2$ of the change in the pitch angle of third beam portion 22 resulting from tilting main body 124 in direction A about hinge axis 133 also decreases pitch angle $\rho$. Component $\Delta\rho_2$ is contributed by diffracting surface 15 tilting in direction C about axis 135, and is given by.

$$\Delta\rho_2 = (\cos\theta_I + \cos\theta_D) \times (\cos\alpha) \times \Delta\sigma \quad (3)$$

For example, in an embodiment in which the angle of incidence $\theta_I$ on diffracting surface 15 is 76.5° and base angle $\alpha$ of main body 124 is 68.5°, for a change of 1° in direction A in the tilt of main body 124 about hinge axis 133 ($\Delta\sigma=1°$), component $\Delta\rho_2$ determined by equation (3) is a decrease of approximately 0.42° in the pitch angle.

The angle of diffraction $\theta_D$ of diffraction grating 14 is given by:

$$\theta_D = \sin^{-1}\left[\frac{\lambda}{p_g} - \sin\theta_I\right] \quad (4)$$

In an embodiment in which the pitch $p_g$ of diffraction grating 14 is 1.111 μm, the angle of incidence $\theta_I$ on diffracting surface 15 is 76.5° and the wavelength $\lambda$ is 1.55 μm, the angle of diffraction $\theta_D$ is 25.00°.

Component $\Delta\rho_3$ of the change in pitch angle of third beam portion 22 resulting from tilting main body 124 in direction A increases pitch angle $\rho$. Component $\Delta\rho_3$ is contributed by the grooves of diffracting surface 15 rotating in direction D about axis 136, and is given by:

$$\Delta\rho_3 = (\sin\theta_I + \sin\theta_D) \times (\sin\alpha) \times \Delta\sigma \quad (5)$$

For example, in the above-described embodiment in which the angle of incidence $\theta_I$ on diffracting surface 15 is 76.5° and base angle $\alpha$ of main body 124 is 68.5°, for a change of 1° in direction A in the tilt of main body 124 about hinge axis 133 ($\Delta\sigma=1°$), component $\Delta\rho_3$ determined by equation (5) is an increase of approximately 1.30° in the pitch angle.

The three components of the change in pitch angle $\rho$ combine linearly for small angles, so that the resulting change $\Delta\rho$ in the pitch angle of third beam portion 22 is given by:

$$\Delta\rho = -\Delta\rho_1 - \Delta\rho_2 + \Delta\rho_3 \quad (6)$$

For example, in the above-described embodiment, for a change of 1° in direction A in the tilt of main body 124 about hinge axis 133 ($\Delta\sigma=1°$), the change $\Delta$92 in pitch angle $\rho$ determined by equation (6) is an increase of approximately $-0.245-0.42+1.30=0.635°$ in the pitch angle. In other words, the overall effect is that the change $\Delta\rho$ in the pitch angle of third beam portion 22 is 0.635° of increased divergence from (or decreased convergence on) major surface 172 for each degree of change in direction A in the tilt of main body 124 about hinge axis 133.

In ECL 100, light incident on the reflective surface 17 of tuning mirror 16 at an angle of incidence having a non-zero pitch component is reflected by the reflective surface at an angle of reflection having a pitch component equal to the pitch component of the angle of incidence. Thus, the pitch component of the angle between the direction of the light emitted by modified laser diode 11 and the direction of the light returning to the modified laser diode changes by twice the change $\Delta$92 in pitch angle $\rho$. The pitch component of the angle between the direction of the light emitted by the modified laser diode and the direction of the light returning to the modified laser diode will be called the return angle pitch component. Thus, a change $\Delta\rho$ in the pitch angle causes a change equal to 2 $\Delta\rho$ in the return angle pitch component. In the above example, each one-degree change in direction A in the tilt of main body 124 about hinge axis 133 changes the return angle pitch component by about +1.27°.

A sensitivity factor can be determined for the adjustment provided by mount 120 by dividing the change in the return angle pitch component by the change in the tilt angle of main body 124. In the embodiment just exemplified, the sensitivity factor is 1.27/1=1.27.

Figure 7:
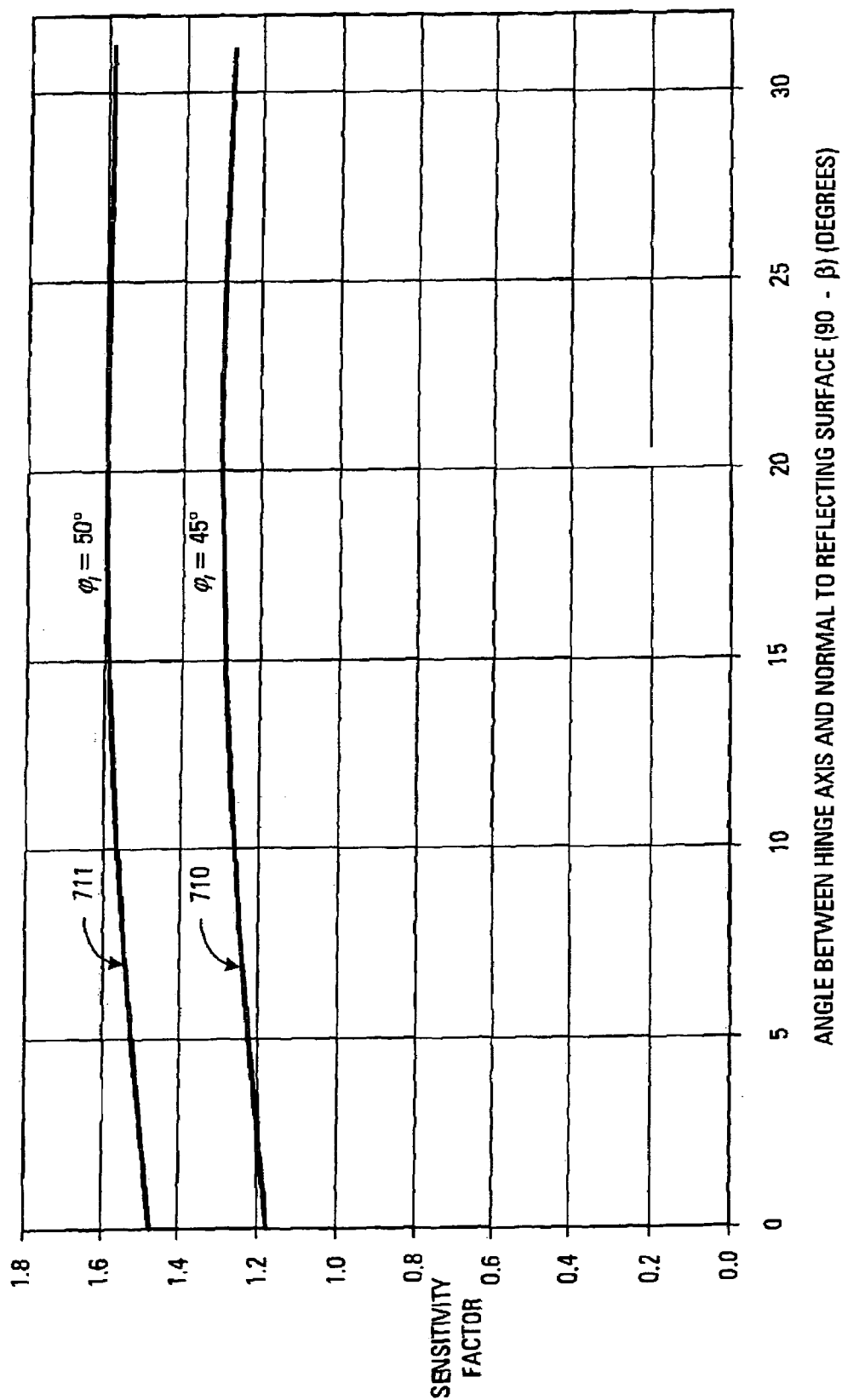
FIG. 7 is a graph illustrating the effect of various geometric factors on the sensitivity factor of the mount shown in FIG. 2.

The sensitivity factor is relatively insensitive to the configuration of mount 120. FIG. 7 is a graph that shows the dependence of the sensitivity factor on the angle between hinge axis 133 and the normal to reflecting surface 112 for embodiments of the mount configured for an angle of incidence of 45° on the reflecting surface (curve 710) and for embodiments of the mount configured for an angle of incidence of 50° on the reflecting surface (curve 711). The angle between the hinge axis and the normal to the reflecting surface is the complement of base angle $\beta$, i.e., the angle equals 90°−$\beta$.

In the embodiments of mount 120 configured for an angle of incidence of 45° represented by curve 710, the vertex angle $\gamma$ between external surface 126 and external surface 127 is 31.5°, given by:

$$\gamma = \theta_I - \phi_I = 76.5° - 45° = 31.5°.$$

The left-hand end of the ordinate scale (90°−$\beta$) corresponds to an embodiment in which reflecting surface 112 is orthogonal to hinge axis 133 ($\beta=90°$ and $\alpha=58.5°$). The right-hand end of the ordinate scale corresponds to an embodiment in which diffracting surface 15 is orthogonal to the hinge axis ($\beta=58.5°$ and $\alpha=90°$).

In the embodiments of mount 120 configured for an angle of incidence of 50° represented by curve 711, the vertex angle $\gamma$ between external surface 126 and external surface 127 is 31.5°, given by:

$$\gamma = \theta_I - \phi_I = 76.5° - 50° = 26.5°.$$

The left-hand end of the ordinate scale (90°−$\beta$) corresponds to an embodiment in which reflecting surface 112 is orthogonal to hinge axis 133 ($\beta$−90° and $\alpha=63.5°$). The right-hand end of the ordinate scale corresponds to an embodiment in which diffracting surface 15 is orthogonal to the hinge axis ($\beta=58.5°$ and $\alpha=90°$). Embodiments outside the range illustrated in FIG. 7 are possible. For example, in some embodiments, at least one of base angles $\alpha$ and $\beta$ may be obtuse.

Figure 8:
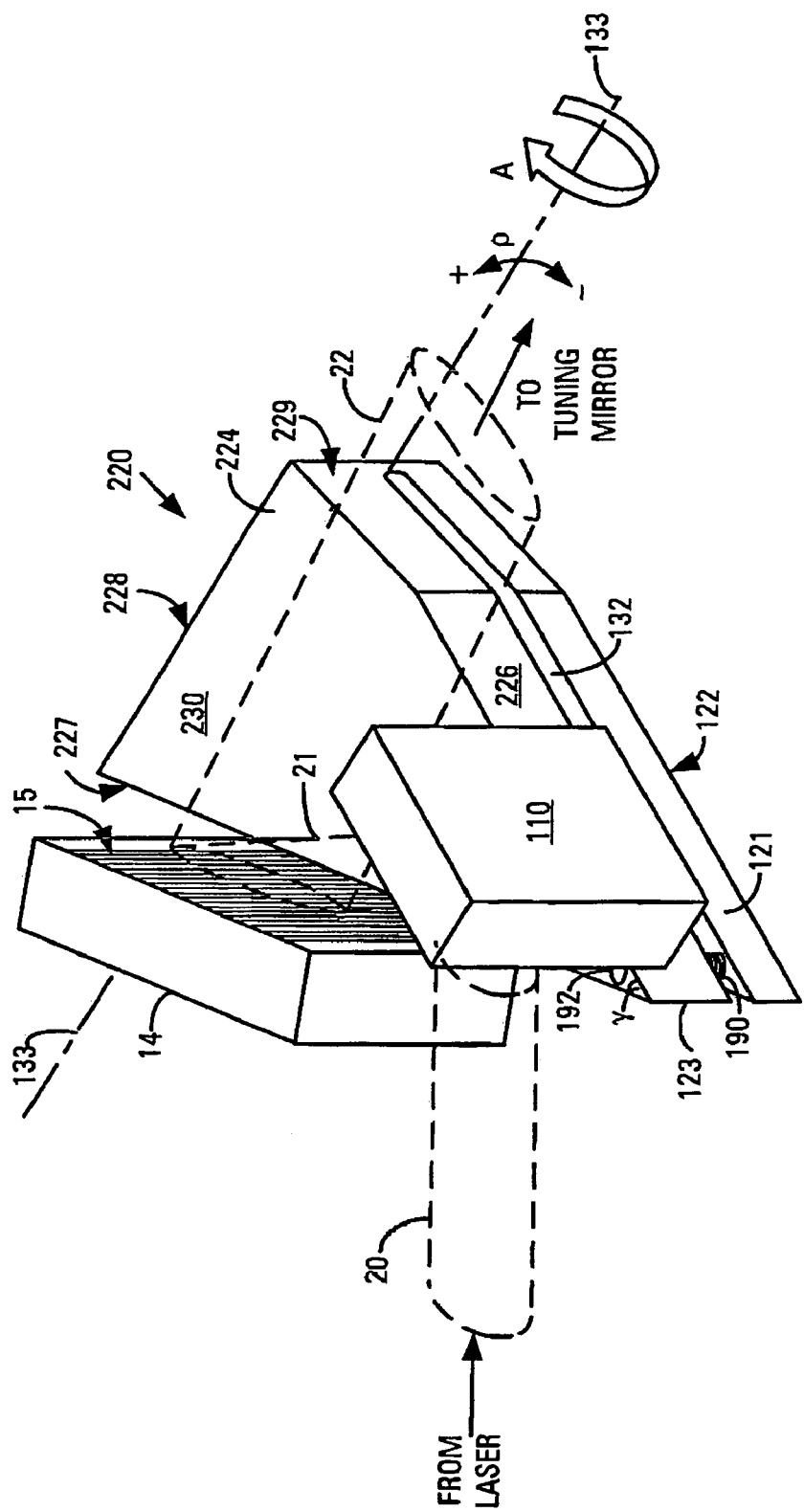
FIG. 8 is an isometric view of a second embodiment of a mount in accordance with the invention.

As noted above, the main body of the mount is configured to allow light to pass between the reflecting surface of the folding mirror and the diffracting surface of the diffraction grating. However, the main body need not include access aperture 131 shown in FIG. 4. FIG. 8 shows a second embodiment 220 of a mount that may be incorporated in ECL 100 instead of mount 120 shown in FIGS. 2-6. Elements of mount 220 that correspond to elements of mount 120 described above with reference to FIGS. 2-6 are indicated using the same reference numerals and will not be described again here.

In mount 220, the heights of main body 224, external surfaces 226 and 227, back surface 228 and surface 229 are reduced compared with corresponding elements of mount 120. In a practical embodiment, main body 224 was fabricated from low-CTE glass, such as Schott Zerodur® glass-ceramic.

Folding mirror 110 is mounted on main body 224 with part of reflecting surface 112 in contact with external surface 226 and the remainder of the reflecting surface projecting above major surface 230 in the height direction. Only a region larger than the portion of the reflecting surface illuminated by first beam portion 20 need be reflective. Diffraction grating 14 is mounted on main body 224 with part of the diffracting surface 15 in contact with external surface 227 and the remainder of the diffracting surface projecting above major surface 230 in the height direction. Only a region larger than the portion of diffracting surface 15 illuminated by second beam portion 21 need be reflective.

A flat plate (not shown) in which a spatial mode suppression aperture is defined may be affixed to external surface 227 with the part of the plate defining the spatial mode suppression aperture projecting above major surface 230. The plate is located to allow first beam portion 21 to pass through the spatial mode suppression aperture. Alternatively, the plate may be L-shaped and affixed to major surface 230. As noted above, the spatial mode suppression aperture defines the width of the first beam portion and suppresses unwanted spatial modes that might otherwise occur in modified laser diode 11.

The invention has been described above with reference to examples in which the reflecting surface and the diffracting surface are surfaces of independent folding mirror 110 and independent diffraction grating 14, respectively. Folding mirror 110 and diffraction grating 14 are mounted on the main body of the mount with the reflecting surface and diffracting surface in contact with the external surfaces of the mount. In a variation on the embodiment of mount 120 shown in FIG. 4, no independent folding mirror is mounted on external surface 126. Instead, at least part of surface 126 constitutes the reflecting surface. Additionally or alternatively, no independent diffraction grating is mounted on external surface 127. Instead, at least part of external surface 127 constitutes the diffracting surface. The main body is configured to allow light to pass between reflecting surface 112 and diffracting surface 15 by making the main body of a transparent material such as low-CTE glass.

In an embodiment in which the refractive index of the material of main body 124 and the angle of incidence $\phi_I$ (FIG. 5) of first beam portion 21 on external surface 126 are such that total internal reflection occurs at external surface 126, external surface 126 is inherently reflecting. In an embodiment in which total internal reflection does not occur at external surface 126, the reflectivity of external surface 126 is increased by a reflective layer deposited thereon. The portion of external surface 127 on which first beam portion 21 is incident is shaped to provide a zero angle of incidence for the first beam portion. A spatial mode suppression aperture may be affixed to the portion of external surface 127 on which the first beam is incident. Grooves molded, machined or otherwise formed in external surface 127 make external surface 127 diffracting.

In a further variation, main body 124 is made of a transparent material and an independent folding mirror and an independent diffraction grating are affixed to external surfaces 126 and 127 of the main body. The transparent material of the main body allows light to pass between reflecting surface 112 and diffracting surface 15.

Figure 9:
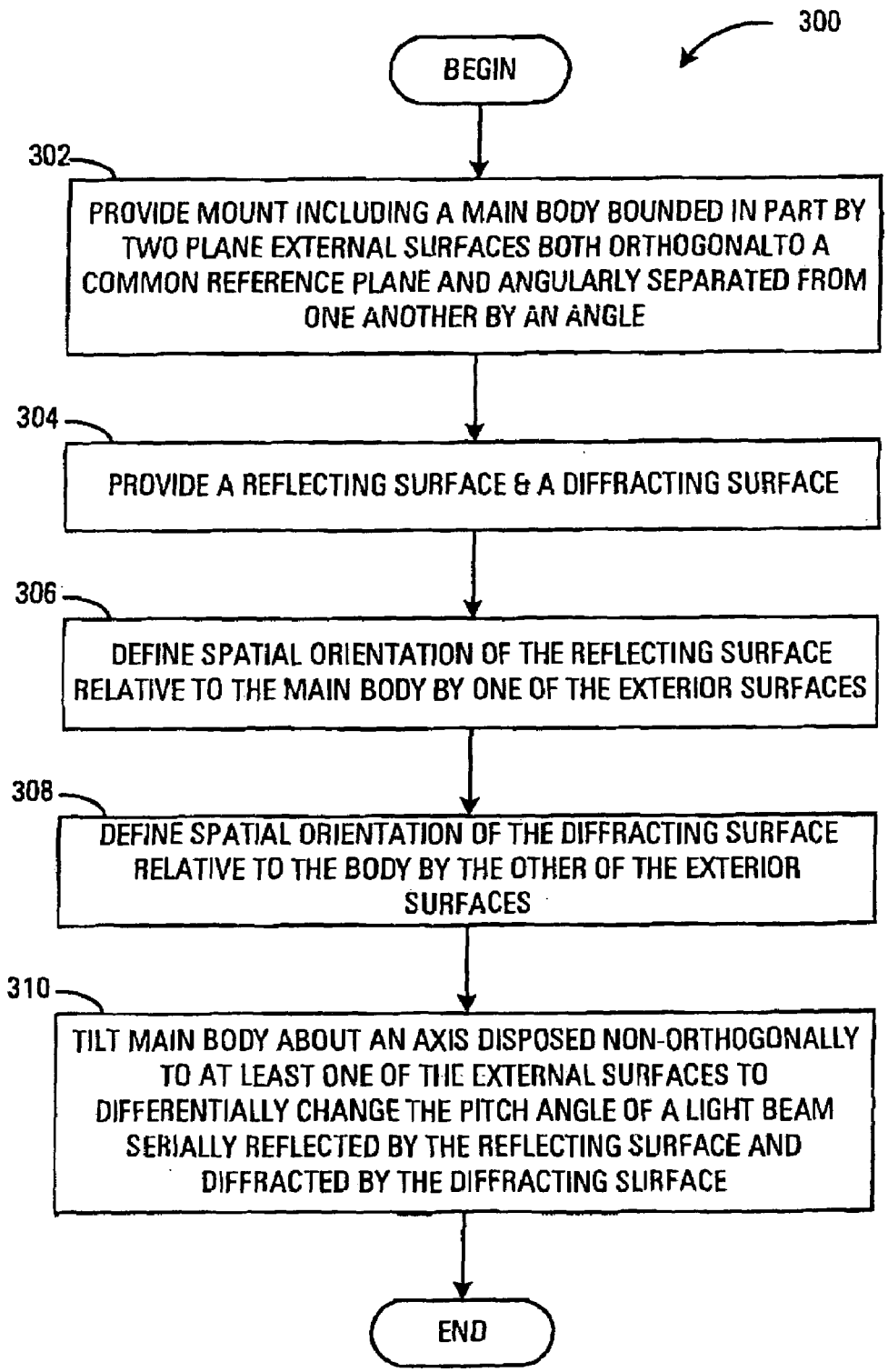
FIG. 9 is a flow chart illustrating an embodiment of a method according to the invention for aligning an external cavity laser.

FIG. 9 is a flow chart illustrating an embodiment 300 of a method according to the invention for aligning an external-cavity laser.

In block 302, a mount is provided. The mount includes a main body bounded in part by two plane external surfaces orthogonal to a common reference plane and angularly separated from one another by an angle.

In block 304, a reflecting surface and a diffracting surface are provided.

In block 306, the spatial orientation of the reflecting surface is defined relative to the main body by one of the external surfaces.

In block 308, the spatial orientation of the diffracting surface is defined relative to the main body by the other of the external surfaces.

In block 310, the mount is tilted about an axis disposed non-orthogonally to at least one of the external surfaces to differentially change the pitch angle of a light beam serially reflected by the reflecting surface and diffracted by the diffracting surface.

Additionally in the method, a light source may be provided, the reflective surface may be illuminated with light generated by the light source and the light diffracted by the diffracting surface may be returned to the light source via the diffracting surface and the reflecting surface.

The light source may emit light in a direction nominally parallel to a plane, and the light may be returned to the light source by providing a pivoting tuning mirror mounted nominally orthogonally to the plane and reflecting the diffracted light with the tuning mirror. In this case, in block 310, tilting the main body changes the pitch angle to cause the diffracted light to be incident on the tuning mirror at an angle of incidence having a pitch component of zero to cause the light to return to the light source notwithstanding errors in the direction of the light emitted by the light source and the mounting of the tuning mirror. Additionally or alternatively, tilting the main body may change the pitch angle to cause the light to return to the light source notwithstanding errors in the orthogonality of the external surfaces to the common reference plane.

Also, in the method, the main body may be configured to allow light to pass between the reflecting surface and the diffracting surface.

Finally, in the method, a folding mirror may additionally be provided. The folding mirror includes the reflecting surface and is mounted on the main body with the reflecting surface in contact with the one of the external surfaces. Additionally or alternatively, a diffraction grating may be provided. The diffraction grating includes the diffracting surface and is mounted on the main body with the diffracting surface in contact with the other of the external surfaces.

This disclosure describes the invention in detail using illustrative embodiments. However, it is to be understood that the invention defined by the appended claims is not limited to the precise embodiments described.

We claim:

1. A mount for optical components, the mount comprising:
   a base;
   a main body bounded in part by two plane external surfaces orthogonal to a common reference plane and angularly separated from one another by an angle;
   a reflecting surface having a spatial orientation defined by one of the external surfaces; and
   a diffracting surface having a spatial orientation defined by the other of the external surfaces;
   a third surface parallel to the reference plane and in contact with the two external surfaces; and
   a hinge located opposite the angle and parallel to the reference plane, the hinge coupling the main body to the base.

2. The mount of claim 1, additionally comprising an adjustment mechanism operable to tilt the main body about the hinge.

3. The mount of claim 2, wherein the adjustment mechanism is operable to:
   tilt the external surfaces about the hinge, wherein the tilting of at least one of the external surfaces includes tilting a component about an axis parallel to the one of the external surfaces.

4. The mount of claim 1, in which the main body defines an access aperture extending therethrough between the external surfaces.

5. The mount of claim 1, in which:
   the hinge defines an hinge axis about which the main body is tiltable; and at least one of the external surfaces is non-orthogonal to the hinge axis.

6. The mount of claim 1, in which the main body is configured to allow light to pass between the reflecting surface and the diffracting surface.

7. The mount of claim 1, in which:
   the one of the external surfaces constitutes at least part of the reflecting surface; and
   the other of the external surfaces is contoured to provide the diffracting surface.

8. The mount of claim 1, additionally comprising at least one of:
   a folding mirror including the reflecting surface, the folding mirror mounted on the main body with the reflecting surface juxtaposed with the one of the external surfaces; and
   a diffraction grating including the diffracting surface, the diffraction grating mounted on the main body with the diffracting surface juxtaposed with the other of the external surfaces.

9. A tunable external cavity laser, comprising:
   a light source;
   a converging lens located to receive light from the light source;
   a tuning mirror;
   a pivoting arm on which the tuning mirror is mounted; and
   a mount including:
      a base,
      a main body bounded in part by two plane, external surfaces orthogonal to a common reference plane and angularly separated from one another by an angle, and
      a hinge located opposite the angle and parallel to the reference plane, the hinge coupling the main body to the base.

10. The laser of claim 9, additionally comprising an adjustment mechanism operable to tilt the main body about the hinge.

11. The laser of claim 10, wherein the adjustment mechanism is operable to:
   tilts the external surfaces about the hinge; and
   the tilting of at least one of the external surfaces includes tilting a component about an axis parallel to the one of the external surfaces.

12. The laser of claim 9, in which the main body defines an access aperture extending therethrough between the external surfaces.

13. The laser of claim 9, in which:
   the hinge defines an hinge axis about which the main body is tiltable; and
   at east one of the external surfaces is non-orthogonal to the hinge axis.

14. The laser of claim 9, in which the main body is configured to allow light to pass between a reflecting surface corresponding to one of the external surfaces and a diffracting surface corresponding to the other external surface.

15. The laser of claim 14, in which:
   the one of the external surfaces constitutes at least part of the reflecting surface; and
   the other of the external surfaces is contoured to provide the diffracting surface.

16. The laser of claim 14, additionally comprising at least one of:
   a folding mirror including the reflecting surface, the folding mirror mounted on the main body with the reflecting surface juxtaposed with the one of the external surfaces; and
   a diffraction grating including the diffracting surface, the diffraction grating mounted on the main body with the diffracting surface juxtaposed with the other of the external surfaces.

17. A method for aligning an external-cavity laser, the method comprising:
   providing a mount including a main body hingeably coupled to a base plate, the main body bounded in part by two plane external surfaces orthogonal to a common reference plane and angularly separated from one another by an angle;
   providing a reflecting surface and a diffracting surface;
   defining a spatial orientation of the reflecting surface by one of the external surfaces;
   defining a spatial orientation of the diffracting surface with the other of the external surfaces;
   tilting the main body about an axis disposed non-orthogonally to at least one of the external surfaces to differentially change pitch angle of a light beam serially reflected by the reflecting surface and diffracted by the diffracting surface.

18. The method of claim 17, additionally comprising:
   providing a light source;
   illuminating the reflecting surface with light generated by the light source; and
   returning light diffracted by the diffracting surface to the light source via the diffracting surface and the reflecting surface.

19. The method of claim 18, in which:
   in providing a light source, a light source that emits the light in a direction nominally parallel to a plane is provided;

returning light diffracted by the diffracting surface includes:
  providing a pivoting tuning mirror mounted nominally orthogonally to the plane, and
  reflecting the diffracted light with the tuning mirror; and
  tilting the main body changes the pitch angle to cause the diffracted light to be incident on the tuning mirror at an angle of incidence having a pitch component of zero to cause the light to return to the light source notwithstanding errors in the direction of the light emitted by the light source and the mounting of the tuning mirror.

20. The method of claim 19, in which tilting the main body changes the pitch angle to cause the light to return to the light source additionally notwithstanding errors in orthogonality of the external surfaces to the common reference plane.

21. The method of claim 17, in which, in providing the mount, the main body is configured to allow light to pass between the reflecting surface and the diffracting surface.

22. The method of claim 17, additionally comprising providing a folding mirror including the reflecting surface, the folding mirror mounted on the main body with the reflecting surface juxtaposed with the one of the external surfaces.

23. The method of claim 17, additionally comprising providing a diffraction grating including the diffracting surface, the diffraction grating mounted on the main body with the diffracting surface juxtaposed with the other of the external surfaces.

24. A mount for optical components, comprising:
  means for bounding a main body in part, said means for bounding orthogonal to a common reference plane and angularly divided with respect to a vertex; and
  means for tilting the main body and the means for bounding.

25. The mount of claim 24, wherein the means for bounding comprises two plane external surfaces.

26. The mount of claim 24, wherein the means for tilting comprises a hinge located opposite the vertex and parallel to the common reference plane, the hinge coupling the main body to a base.

27. The mount of claim 26, wherein the means for tilting comprises an adjustment mechanism operable to tilt the main body and the means for bounding about the hinge.

* * * * *